(12) United States Patent
Chabraya

(10) Patent No.: US 6,236,221 B1
(45) Date of Patent: May 22, 2001

(54) LOW INERTIA MICROCIRCUIT TEST FIXTURE

(76) Inventor: Kenneth M. Chabraya, 871 Salt Lake Dr., San Jose, CA (US) 95133

( * ) Notice: Subject to any disclaimer, the term of this patent is extended or adjusted under 35 U.S.C. 154(b) by 0 days.

(21) Appl. No.: 09/336,539

(22) Filed: Jun. 19, 1999

(51) Int. Cl.$^7$ .............................. G01R 31/02; G01R 31/26
(52) U.S. Cl. ......................... 324/755; 324/765; 324/758; 324/754
(58) Field of Search ................................. 324/755, 765, 324/627, 754, 757, 766, 551, 758; 29/840

(56) References Cited

U.S. PATENT DOCUMENTS

| | | | |
|---|---|---|---|
| 5,559,444 | * | 9/1996 | Farnworth et al. .................. 324/754 |
| 5,634,267 | * | 6/1997 | Farnworth et al. .................... 29/840 |
| 6,028,436 | * | 2/2000 | Akram et al. ......................... 324/755 |

* cited by examiner

*Primary Examiner*—Safet Metjahic
*Assistant Examiner*—Anjan K Deb
(74) *Attorney, Agent, or Firm*—Henry M. Stanley

(57) ABSTRACT

A fixture for use in testing microcircuit assemblies, such as flat panel displays and silicon wafers, has a high dielectric strength or resistivity fixture body with density less than 1.9 gm/cm$^3$. The fixture therefore has low inertial properties and may be used with mechanical positioning components in microcircuit test apparatus in enlarged fixture sizes without diminishing test apparatus response or accuracy characteristics. The fixture body has conductive and insulating layers applied thereto and connecting terminals communicating with the conductive layers so that high voltage, Kelvin, coaxial and triaxial configurations are provided.

7 Claims, 2 Drawing Sheets

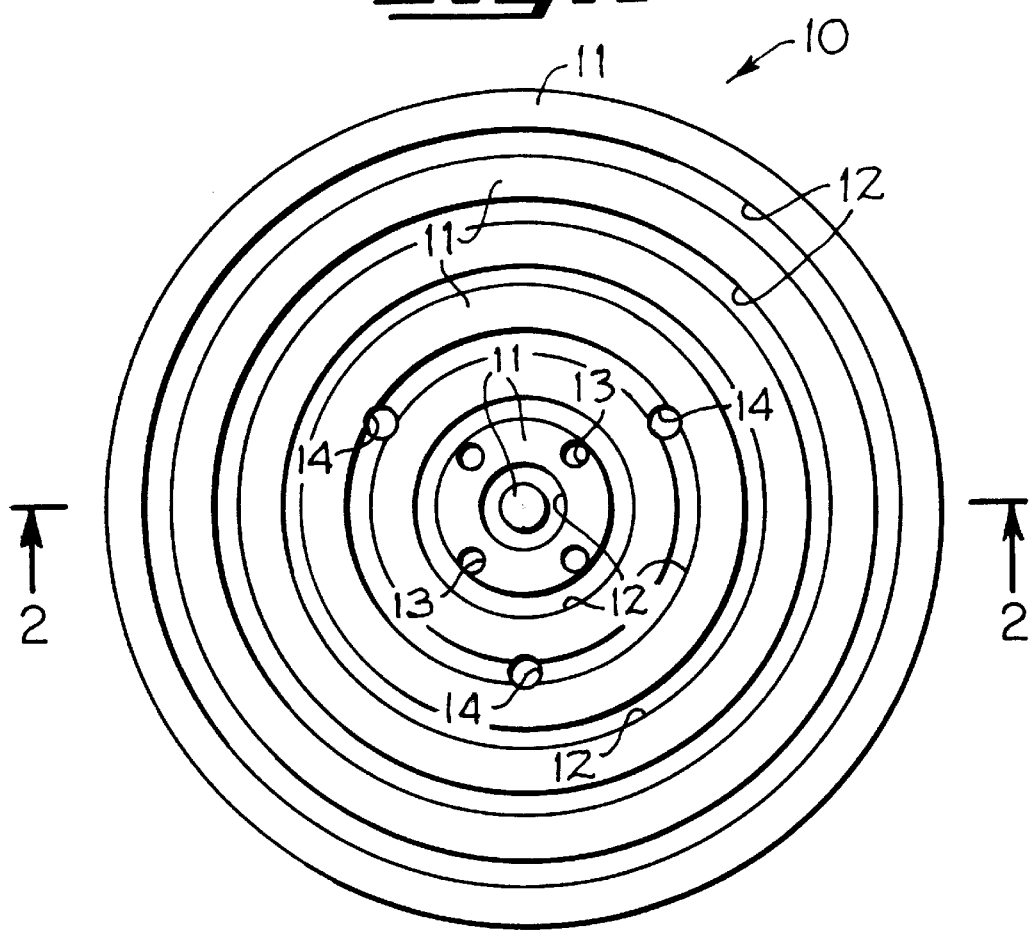
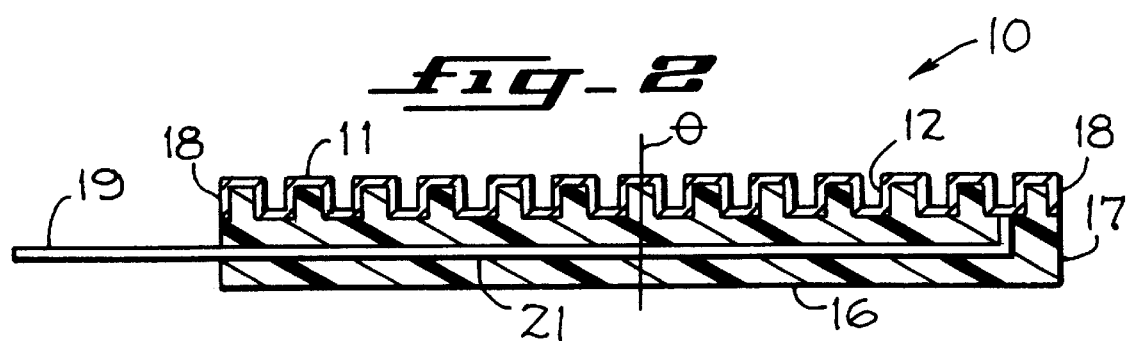
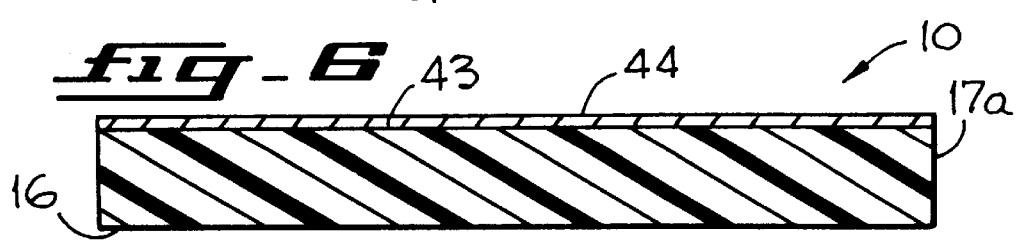

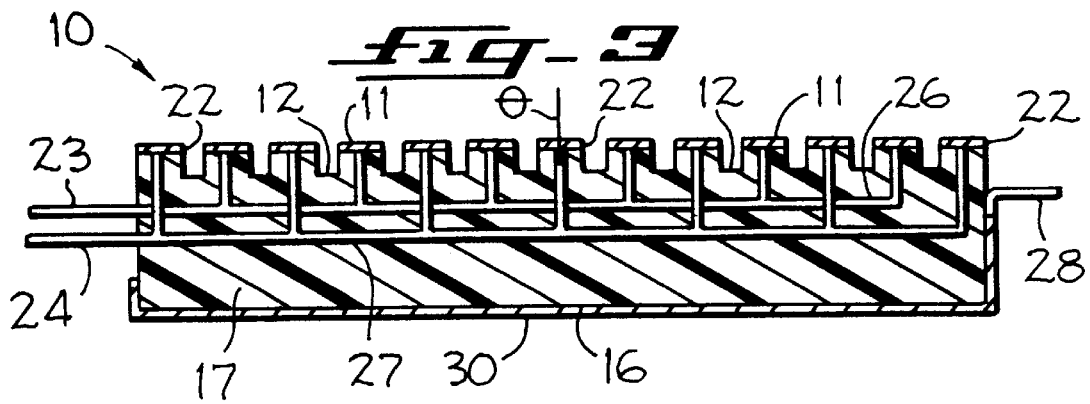
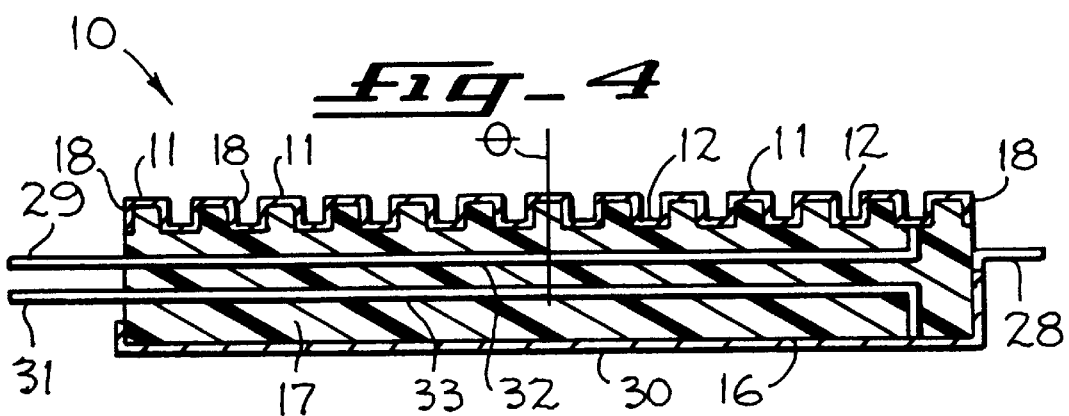
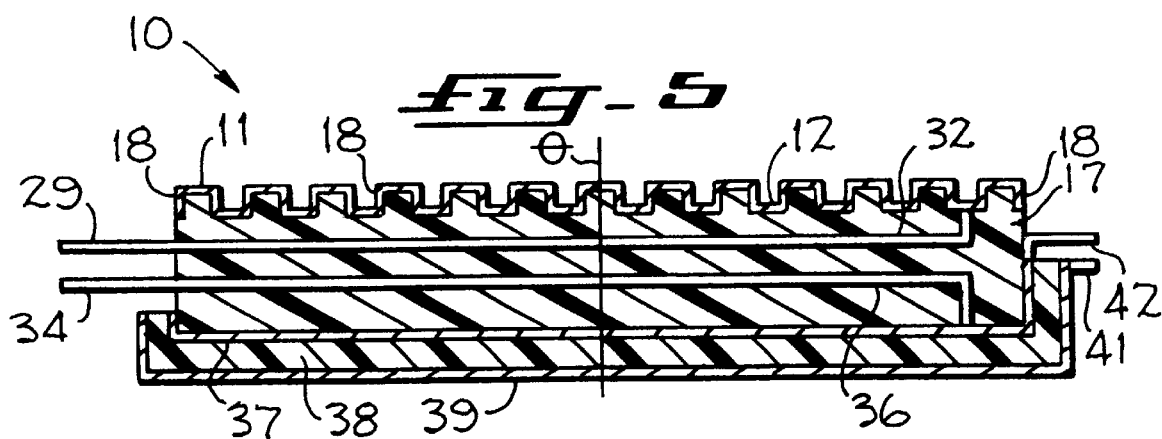

LOW INERTIA MICROCIRCUIT TEST FIXTURE

SUMMARY OF THE INVENTION

A low inertia low signal level microcircuit test fixture is disclosed herein which includes a high resistivity fixture body having an upper surface and a lower surface and having a maximum body density of 1.9 gm/cm$^3$. A plurality of adjacent electrically conductive lands are formed on the fixture upper body surface. A plurality of grooves are positioned between and separating ones of the adjacent electrically conductive lands. At least one accessible electrical connection is available in communication with the adjacent electrically conductive lands.

In another aspect of the invention a low inertia low signal level microcircuit test fixture for mounting on a microcircuit testing apparatus is disclosed which includes a high resistivity fixture body having a body mass density of 1.9 gm/cm$^3$ maximum. The fixture body has an upper surface and a lower surface, the upper surface having a flatness within ±0.0005 inches. The upper surface and the lower surface are parallel within ±0.0007 inches.

In yet another aspect of the invention a low inertial microcircuit test fixture is disclosed wherein a fixture body has a dielectric strength greater than 400 volts/mil and a mass density less than 1.9 gm/cm$^3$. The fixture body has an upper surface and a lower surface thereon. A first electrically conductive layer is attached to and covers the upper surface. A second electrically conductive layer is electrically isolated from the first electrically conductive layer and is attached to and covers the lower surface. Means is provided for separate accessible electrical contact with the first and the second electrically conductive layers.

BRIEF DESCRIPTION OF THE DRAWINGS

FIG. 1 is a plan view of one embodiment of the present invention.

FIG. 2 is a section along the line 2—2 of FIG. 1.

FIG. 3 is a section showing an additional embodiment of the present invention.

FIG. 4 is a section showing yet another embodiment of the present invention.

FIG. 5 shows yet another embodiment of the present invention.

FIG. 6 is a partial section of still another embodiment of the present invention.

DESCRIPTION OF THE PREFERRED EMBODIMENTS

Currently available semiconductor test systems use electromechanical components to move portions of the system rotationally and translationally to position an array of microcircuits for test. The test systems also have various signal requirements which require reduction of spurious signals and isolation of test signals from remaining spurious signals. Thus, the test systems have mechanical capabilities that provide required system response and positioning accuracy as well as test signal isolation so that required signal levels that are free of spurious signals are delivered to the microcircuits or devices under test. The test fixtures used in the test systems to mount various configurations of devices under test (flat panel displays, microcircuits on silicon wafers, etc.) must not degrade the test system mechanical capabilities or the required test signal characteristics.

A body's rotational (polar) movement of inertia about a reference axis is a function of the summation of the mass particles of the body and the square of the distance of the mass particles from the reference axis. Translationally, the inertia of a body is a function of mass or body volume times mass density. For test fixtures having the same volume that are driven by currently used semiconductor positioning and test mechanisms, lower test fixture mass density materials present lesser mechanical loading to the positioning mechanisms. Since the test fixtures, with devices under test mounted thereon, must be moved rotationally and translationally (in usual cases), the test system carrying a test fixture of lower density is able to provide better mechanical response and positioning accuracy. In addition, as fixtures increase in size to accommodate larger semiconductor circuit arrays (larger dimensional silicon wafers and flat panel displays, etc.), the current positioning mechanisms will only maintain required capabilities for testing if the inertial properties of the test fixtures are minimized. For future positioning mechanisms the response and accuracy specifications will be easier to attain with low inertial property test fixtures. At the same time, the test signal requirements of the test system must not be degraded by the test fixture.

With reference now to FIG. 1 of the drawings, a plan view of one type of semiconductor wafer test fixture 10 is shown. The upper surface of the test fixture is shown having a plurality of circular lands 11 formed on the upper surface. The lands 11 are spaced apart by a number of grooves 12. Near the center of the test fixture 10 are four mounting holes 13 through which fasteners are passed to fasten the test fixture to known test equipment (not shown) which moves the test fixture (and therefore any microcircuits mounted thereon) through three dimensions translationally and also rotationally about an axis extending through the center of the test fixture 10 as seen in FIG. 1. The axis of rotation is designated θ, as seen in FIGS. 2, 3, 4 and 5. Three holes 14 are also seen in the test fixture 10 through which movable arms (not shown) on the test equipment to which the test fixture is attached move for the purpose of lifting a microcircuit filled wafer from the upper surface of the test fixture when testing is completed. It should be noted that the test fixture 10 shown in FIG. 1 is but one of many configurations depending on the size and shape of the microcircuit array being tested. In the example shown in FIG. 1 seven rings or lands 11 are shown, but the number of lands and grooves could be fewer or greater. In the example shown the diameter of the test fixture 10 is approximately six inches and the depth of the grooves 12 is approximately 0.050 inches. The grooves 12 are communicated with channels (not shown) running through the body of the test fixture 10 for the purpose of applying vacuum or delivering pressure to the grooves 12 to control fixation or removal of a microcircuit filled wafer from the upper surface of the test fixture respectively. Further, the upper surface of the test fixture may be uninterrupted by the grooves 12 in which case the upper surface of the test fixture is flat, as seen in FIG. 6 at surface 43. In any event the flatness of the upper surface of the test fixture across the plurality of lands 11, or across the completely flat surface 43 (having a plating layer 44 thereon), is closely controlled and kept within ±0.0005 inches. In addition, the upper surface of the test fixture across the plurality of lands 11, or across the entire plated surface 43, is maintained parallel to a lower surface 16 (FIG. 2) within ±0.0007 inches. These tolerances are typical for microcircuit filled silicon wafer test fixtures or mounting chucks. To maintain such tolerances there must be a certain rigidity in the test fixture 10. As best seen in FIG. 2, the test fixture has a body 17 with a thickness dimension from the upper surface described by the lands 11 to the lower surface 16 which is sufficient to maintain the dimension across the diameter of the test fixture within the aforesaid tolerances. It is envisioned that the light weight fixtures disclosed herein will have dimensions and tolerances throughout that are substantially the same as their current metallic counterparts.

With reference to FIG. 2, a configuration of the low inertia, low signal level microcircuit test fixture of the present invention is shown wherein the lands 11 and grooves 12 are covered by a common electrically conductive coating 18. An electrically accessible terminal 19 is connected to a conducting path 21 which is embedded within the fixture body 17 and is electrically connected to the conductive plating 18. The fixture body 17 is fabricated in one embodiment of a material called Ultem™ available from Professional Plastics, Sunnyvale, Calif. Ultem™ has a mass density of about 1.25 gm/cm$^3$. An additional material which is suitable for the fixture body 17 is Torlon™, available from Professional Plastics. Another material known as G-10™ is appropriate for the fixture body 17 of this invention which is also available from the same supplier. Torlon™ has a mass density of about 1.44 gm/cm$^3$, and G-10™ material has a mass density of about 1.9 gm/cm$^3$. It may be seen from the foregoing that the three materials mentioned for utilization in the fabrication of the test fixture body 17 of the present invention have mass densities which are no greater than 1.9 gm/cm$^3$. This compares with 2.72 gm/cm$^3$ for the aluminum material currently widely used in the fabrication of the bodies of semiconductor test fixtures.

It is envisioned that the aforementioned materials useful in the fabrication of test fixture bodies 17 will also be called upon to provide testing at elevated temperatures as well as depressed temperatures. These materials generally exhibit temperature stability characteristics and coefficients of expansion which ideally suit them for higher and lower temperature testing conditions. These temperature characteristics compare favorably with temperature characteristics of aluminum material currently-used in the fabrication of test fixture bodies.

It is also of importance that the materials from which the test fixture bodies 17 are fabricated have a high dielectric strength or resistivity characteristic. Ultem™ and Torlon™, for example, have a resistivity of $10^{17}$ Ohms cm. Expressed another way, Ultem™ has a dielectric strength of 830 volts/mil. G-10 exhibits a dielectric strength of 550 volts/mil. High dielectric strength or resistivity in the material from which the fixture body is fabricated is important in the high voltage application of FIG. 2 because electrical potentials in the range of three to five Kilovolts are applied to the conductive plating 18 and leakage to the supporting structure contacting the lower surface 16 of the fixture body must be kept to a minimum. Further, leakage currents which affect measurements taken during microcircuit testing while mounted on the upper surface of the test fixture 10 are characteristically small and are sometimes measured in the picoampere ($10^{-12}$) or femtoampere ($10^{-15}$) ranges. Even with very high resistivity and dielectric strength characteristics in the body 17 of the test fixture disclosed herein, other methods of eliminating or diverting leakage currents from the signal to be measured are employed as will hereinafter be explained.

In FIG. 3 of the drawings a plating 22 is deposited on the tops of the lands 11, there being no conductive paths along the upper surface of the test fixture 10 between adjacent lands. A pair of accessible electrical terminals 23 and 24 as seen in FIG. 3 are provided which extend from one side of the fixture body 17. The electrical terminal 23 is connected to a conducting path 26 which is embedded in the fixture body 17. The conducting path 26 is coupled electrically to the conductive plating 22 on alternate ones of the lands 11 as seen in FIG. 3. The electrical terminal 24 is connected to a conductive path 27 also embedded within the body 17 of the test fixture 10 and is connected to the conductive plating 22 on alternate lands 11. In this fashion proceeding across the upper surface of the test fixture 10 the conductive plating 22 is electrically connected to alternate ones of the electrical terminals 23 and 24. The connection depicted in FIG. 3 represents a "Kelvin" connection. "Kelvin" contacts are defined as contacts which are designed to eliminate the effect of lead resistance on the accuracy of measurement. In such a connection two leads run to each test point, one lead carrying the test signal and the other lead proceeding directly to the measuring instrument. One of the electrical terminals 23 and 24 is designated the "force" terminal and the other is designated the "sense" terminal. These designations may be reversed. The purpose is only to alternate the force and the sense connections so that a Kelvin connection is obtained. Additionally, a conductive layer 30 is attached to the lower surface 16 of the fixture body 17 which operates as a shield for the internal conducting paths within the fixture body. A third electrical terminal 28 is shown in FIG. 3 to which a connection to electrical ground is made. While the test fixture 10 is moved by the semiconductor testing apparatus in three dimensions translationally, it is also moved rotationally. The axis of rotation through the center of the fixture 10 is designated θ in FIG. 3.

FIG. 4 shows a coaxial configuration of the test fixture 10 of the present invention. The plating layer 18 (FIGS. 2 and 4) is seen running across the upper surface of the test fixture 10 in a continuous manner across all of the lands 11 and grooves 12 from edge to edge on the fixture. A pair of electrically accessible terminals 29 and 31 are seen in FIG. 4. Terminal 29 is connected to an embedded conducting path 32 within the fixture body 17, which is in turn connected to the conducting plating 18 fixed to the upper surface of the test fixture 10. Terminal 31 is connected to an embedded conducting path 33, which is connected to the shielding conducting layer 30 mentioned in conjunction with FIG. 3 hereinbefore. The shielding layer has for convenience the electrically accessible terminal 28 as also mentioned hereinbefore in connection with FIG. 3. The low mass density of the Ultem™ material from which the fixture body 17 is fabricated allows for relatively low inertia in the test fixture 10 so that the test fixture may readily be moved translationally or rotationally about the axis θ with test equipment currently in use even when the test fixture 10 is required to be considerably enlarged to accommodate larger sized silicon wafers carrying larger arrays of microcircuits.

When measuring test signals in the femtoampere range ($10^{-15}$) or even smaller, strict attention must be paid to the elimination of spurious currents. Currents generated by charges created between a conductor and an insulator due to friction are called triboelectric currents. These currents result when free electrons rub off of the conductor and create a charge imbalance that causes current flow. Insulators and conductors rubbing together in a coaxial cable generate triboelectric currents. The embodiment of the test fixture 10 shown in FIG. 5 is intended to eliminate and/or reduce all currents which are spurious to the test signal including triboelectric currents. A continuous plating 18 is seen across the entire upper surface of the test fixture of FIG. 5, continuously spanning all of the lands 11 and the grooves 12.

The electrically accessible terminal 29 is connected to the embedded conducting path 32 and connected to the conductive plating layer 18 affixed to the upper surface of the test fixture 10. Another electrically accessible terminal 34 is shown connected to another embedded conducting path 36 which is connected to an electrically conductive plating layer 37 fixed across the lower surface 16 of the fixture body 17. A dielectric layer 38 is laid atop the electrically conductive layer 37 and another electrically conductive layer 39 is laid over the dielectric layer 38. An electrically accessible terminal 41 is shown in FIG. 5 connected to the outermost electrically conductive layer 39 and is termed the ground terminal. An additional electrically accessible terminal 42 is shown connected to the electrically conductive layer 37 which is termed the "guard" terminal. The electrical connection of FIG. 5 for the test fixture 10 is utilized when test signals are in the femtoampere range ($10^{-5}$) or lower. All spurious currents must be eliminated from the measurement to obtain accuracy in the low signal measurements. The triaxial connection of FIG. 5 is known in principal and is used to shunt spurious currents from the signal being measured. Minute triboelectric current levels are diverted from the measurement signal through the use of the "guard" configuration illustrated in FIG. 5. It has been found that signals below 1 picoampere ($10^{-12}$) cannot be accurately measured without "guarding" to eliminate spurious signals from the signal being measured. The test fixture 10 of FIG. 5 is therefore able to be moved translationally as well as rotationally about the axis θ by currently available test equipment without degrading system positioning accuracy and response. This results even when the test fixture dimensions are considerably enlarged to accommodate larger diameter silicon wafers containing microcircuits to be tested and is due to the low inertia qualities of the material from which the test fixture body 17 is fabricated.

It should be noted with reference to FIG. 6 that the test fixture 10 is shown with an upper surface 43 which is flat, there being an absence of lands and grooves thereon. The embodiment of FIG. 6 is similar in all respects to the embodiments of FIGS. 2,4 and 5 except that the upper surface 43 is flat and has a flat plating layer 44 laid thereon. The pneumatic means for controlling the fixing and removal of a silicon wafer containing microcircuits to be tested is controlled by channels (not shown) running through the body 17a of the embodiment of FIG. 6 and through apertures (not shown) through the upper surface 43 and the plating layer 44 in a manner known to those in this art. The inertial advantages and the signal isolation advantages mentioned hereinbefore are available with the test fixture 10 configuration of FIG. 6.

Although the best mode contemplated for carrying out the present invention has been shown and described herein, it will be understood that modification and variation may be made without departing from what is regarded to be the subject matter of the invention.

What is claimed:

1. A low inertia low signal level microcircuit test fixture for testing an array containing a plurality of individual microcircuits, wherein the testing process requires rapid response and accurate positioning of the array both translationally and rotationally, comprising a high resistivity fixture body having an upper surface and a lower surface, said fixture body having a maximum body mass density of 1.9 gm/cm$^3$, a plurality of adjacent electrically conductive lands on said fixture body upper surface, a plurality of grooves positioned between and separating ones of said adjacent electrically conductive lands, means for providing electrical communication between a first group of alternate ones of said plurality of adjacent electrically conductive lands, means for providing electrical communication between a second group of alternate ones of said plurality of adjacent electrically conductive lands, accessible terminal means in electrical communication with said first group and said second group of adjacent electrically conductive lands, a first conductive layer covering said lower surface, and an additional accessible terminal in electrical communication with said first electrically conductive layer.

2. The low inertia low signal level microcircuit test fixture of claim 1, comprising an electrical connection between said first group and said second group of adjacent electrically conductive lands, an electrical insulation layer covering said first electrically conductive layer, a second electrically conductive layer covering said electrical insulation layer, and wherein said accessible terminal means electrical communication comprises a first accessible terminal in electrical communication with said plurality of adjacent electrically connected lands, further comprising a second accessible terminal in electrical communication with said second electrically conductive layer.

3. The test fixture of claim 1 wherein said fixture body has a dielectric strength of at least 400 volts/mil.

4. A low inertia low signal level microcircuit test fixture for testing large uncut semiconductor circuit arrays utilizing low test signals and high test voltages and being configured for mounting in a microcircuit testing apparatus, comprising a high resistivity fixture body, said fixture body having a body mass density of 1.9 gm/cm$^3$ maximum, said fixture body having an upper surface and a lower surface, a first electrically conductive layer adhering to said upper surface, a first accessible terminal in electrical communication with said first electrically conductive layer, a second electrically conductive layer adhering to said lower surface, a second accessible terminal in electrical communication with said second electrically conductive layer, an electrical insulation layer covering said second conductive layer a third electrically conductive layer overlying said electrical insulation layer, and a third accessible terminal in electrical communication with said third electrically conductive layer.

5. The fixture of claim 4 wherein said fixture body has a resistivity of $10^{17}$ ohm-cm minimum.

6. A low inertia microcircuit test fixture for mounting an uncut semiconductor wafer in a dynamic translational and rotational environment, the wafer having a substantial number of independent microcircuits fabricated thereon, the test fixture further being for use in a test system capable of measuring test signals below one picoampere, comprising a fixture body having dielectric strength greater than 400 volts/mil and a mass density less than 1.9 gms/cm$^3$, an upper surface and a lower surface on said fixture body, a first electrically conductive layer attached to and covering said upper surface, means for holding the uncut semiconductor wafer on said first electrically conductive layer, a second electrically conductive layer electrically isolated from said first electrically conductive layer and attached to and covering said lower surface, a dielectric layer overlying said second electrically conductive layer, a third electrically conductive layer electrically isolated from said first and second electrically conductive layers attached to and covering said dielectric layer, and means for providing separate accessible electrical contact with said first, second and third electrically conductive layers.

7. The test fixture of claim 6 wherein said fixture body has a resistivity of substantially $10^{17}$ ohm-cm.

\* \* \* \* \*